US011139016B1

(12) United States Patent
Pellizzer et al.

(10) Patent No.: US 11,139,016 B1
(45) Date of Patent: Oct. 5, 2021

(54) READ REFRESH OPERATION

(71) Applicant: Micron Technology, Inc., Boise, ID (US)

(72) Inventors: Fabio Pellizzer, Boise, ID (US); Karthik Sarpatwari, Boise, ID (US); Innocenzo Tortorelli, Cernusco sul Naviglio (IT); Nevil N. Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/842,524

(22) Filed: Apr. 7, 2020

(51) Int. Cl.
*G11C 7/00* (2006.01)
*G11C 11/406* (2006.01)
*G11C 11/409* (2006.01)
*G11C 11/4076* (2006.01)
*G11C 11/4074* (2006.01)

(52) U.S. Cl.
CPC ...... *G11C 11/40615* (2013.01); *G11C 11/409* (2013.01); *G11C 11/4074* (2013.01); *G11C 11/4076* (2013.01)

(58) Field of Classification Search
CPC .......... G11C 11/40615; G11C 11/4074; G11C 11/4076; G11C 11/409
USPC ........................................................ 365/222
See application file for complete search history.

(56) References Cited

U.S. PATENT DOCUMENTS

| 7,643,373 | B2 | 1/2010 | Sheu et al. |
| 7,782,651 | B2* | 8/2010 | Tokunaga ............. H01L 27/105 365/148 |
| 10,269,442 | B1 | 4/2019 | Tortorelli et al. |
| 2006/0158948 | A1 | 7/2006 | Fuji |
| 2012/0311228 | A1* | 12/2012 | Hsu ..................... G11C 13/0007 711/102 |
| 2013/0336051 | A1 | 12/2013 | Jurasek et al. |
| 2016/0027508 | A1* | 1/2016 | Lee ..................... G11C 13/0033 365/148 |

FOREIGN PATENT DOCUMENTS

WO    2015199837 A1    12/2015

OTHER PUBLICATIONS

U.S. Appl. No. 16/684,526, by Yang et al., filed Nov. 14, 2019 (53 pages).
ISA/KR, International Search Report and Written Opinion of the International Searching Authority, Int'l Appl. No. PCT/US2021/022699, dated Jul. 7, 2021, Koreran Intellectual Property Office, Seo-gu, Daejeon, Republic of Korea, 11 pgs.

* cited by examiner

*Primary Examiner* — Huan Hoang
(74) *Attorney, Agent, or Firm* — Holland & Hart LLP

(57) ABSTRACT

Methods, systems, and devices for read refresh operations are described. A memory device may include a plurality of sub-blocks of memory cells. Each sub-block may undergo a quantity of access operations (e.g., read operations, write operations). Based on the quantity of access operations performed on any one sub-block over a period of time, a read refresh operation may be performed on the memory cells of the sub-block. A read refresh operation may refresh and/or restore the data stored to the memory cells of the sub-block, and be initiated based on the memory device receiving an operation code (e.g., from a host device).

25 Claims, 10 Drawing Sheets

READ REFRESH OPERATION

BACKGROUND

The following relates generally to one or more memory systems and more specifically to read refresh operations.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
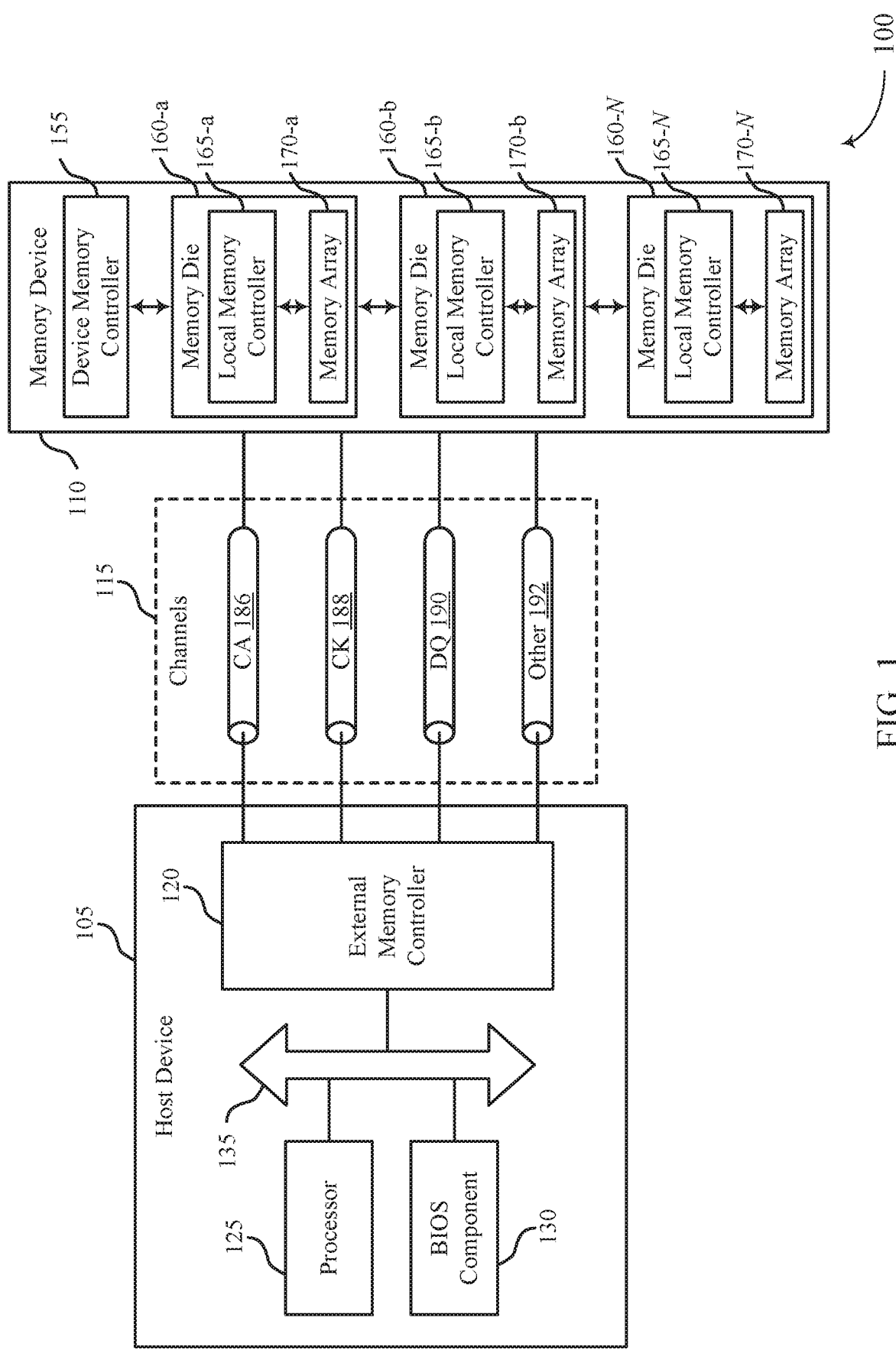
FIG. 1 illustrates an example of a system that supports read refresh operations in accordance with examples as disclosed herein.

A memory device may include a plurality of memory cells that are subdivided into one or more sub-blocks (e.g., sub-blocks of memory cells). The memory cells within any one sub-block may be accessed (e.g., read from, written to) over a period of time. In some examples, a memory cell may be read a relatively large quantity of times without being written to, which may increase the likelihood of an error occurring. Periodically refreshing the memory cell may reduce or minimize the likelihood of such errors.

In a traditional memory system, the memory device may receive operation codes (e.g., op-codes) associated with access operations (e.g., read operations) and operation codes associated with refresh operations. The memory device may queue the received op-codes and perform those op-codes. Receiving different operation codes for different operations, as compared with receiving a single op-code that causes multiple aspects to occur, may increase overall system latency, and may increase the complexity of the system due to multiple operation codes being received (and subsequently decoded). Accordingly, a system configured to receive a single operation code configured to read and refresh the memory cells of a sub-block may be beneficial.

A memory device configured to receive and initiate a single operation code to read and refresh the memory cells of a sub-block is described herein. In some examples, a controller or a memory device may include a counter and/or counter table to track and store a quantity of access operations performed on the sub-blocks. After a predefined period of time, each of the sub-blocks may have undergone a quantity of access operations. Based on the quantity of access operations performed on any one sub-block, a read refresh operation may be performed. During a read refresh operation, the logic state of the respective memory cell(s) may be determined and, depending on the programmed state, memory cell(s) may be refreshed. Refreshing the programmed state of a memory cell may reinforce the data stored to the memory cell, which may reduce the likelihood of an error occurring. Moreover, the read refresh operation may be initiated based on the memory device receiving a single operation code, which may reduce the overall system latency, and may decrease the complexity of the system because only one operation code may be decoded. In some cases, the first counter and/or counter table may track and store a quantity of read operations performed on the sub-blocks over a period of time. In some cases, a second counter and/or counter table may track and store a quantity of write operations performed on the sub-blocks, which may be used with the read operation to determine whether a read refresh operation should be performed.

Features of the disclosure are initially described in the context of memory systems, dies, and arrays as described with reference to FIGS. 1-3. Features of the disclosure are described in the context of timing diagrams and a memory system as described with reference to FIGS. 4A-7. These and other features of the disclosure are further illustrated by and described with reference to an apparatus diagram and flowcharts that relate to read refresh operations as described with references to FIGS. 8-10.

FIG. 1 illustrates an example of a system 100 that supports read refresh operations in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105. In some examples, the host device 105 may initiate a read refresh operation as discussed herein. For example, the host device 105 may receive (e.g., periodically receive) information pertaining to a quantity of access operations performed on individual sub-blocks of memory cells over a period of time. Based on the quantity of access operations performed, the host device 105 may generate and transmit an operation code configured to initiate a read refresh operation.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package. In some examples, each memory die 160 may include one or more sub-blocks of memory cells. Each sub-block may include a subset of the total quantity of memory cells of the memory die 160.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the quantity of access operations performed on memory cells of the memory device 110 may be tracked (e.g., tracking read operation, tracking write operations, tracking refresh operations, or any combination thereof). For example, each time an access operation is performed on a sub-block of a memory die 160, an associated counter may be incremented (e.g., incremented by a local memory controller 165 and/or device memory controller 155). The values tracked by the counter may be stored to a table managed by the memory device 110 (and may be provided to the host device 105 periodically) or may be tracked by the host device 105. Based on a sub-block experiencing a relatively low quantity of access operations over a period of time, the host device 105 may generate an operation code to perform a read refresh operation on the particular sub-block. The operation code may be issued to the memory device 110 and the data stored to the memory cells of the particular sub-block may be refreshed and/or restored. Performing read refresh operations on the sub-blocks of the memory device 110 may prevent (e.g., mitigate) data loss and/or corruption due to programmed logic states transitioning due to a relatively low quantity of write operations being performed, and may reduce overall system latency and media management complexity of the memory device 110.

Figure 2:
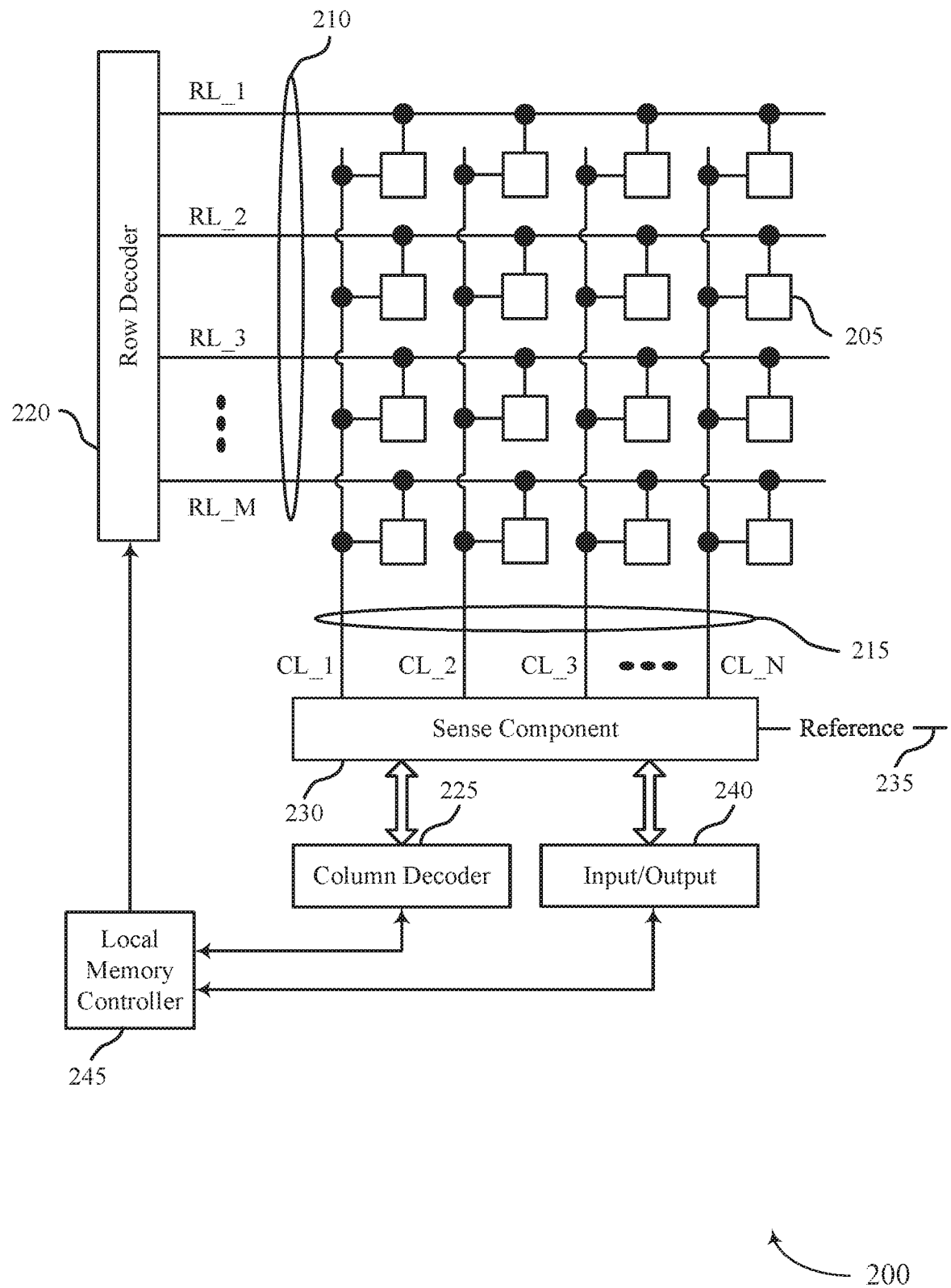
FIG. 2 illustrates an example of a memory die that supports read refresh operations in accordance with examples as disclosed herein.

FIG. 2 illustrates an example of a memory die 200 that supports read refresh operations in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The local memory controller 260 may apply a specific signal (e.g., write pulse) to the column line 215 during the write operation to store a specific state in the storage element of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 260 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration.

In some examples, the memory cells 205 may be part of a sub-block of memory cells. The quantity of access operations performed on the memory cells 205 may be tracked (e.g., tracked by the local memory controller 245). Each time an access operation is performed on a memory cell 205, the local memory controller 245 may increment a counter, and the values tracked by the counter may be stored to a table (not shown). Periodically, the stored values may be transmitted to a host device. Based on the sub-block of memory cells experiencing a relatively low quantity of access operations over a period of time, the host device may generate an operation code to perform a read refresh operation on the particular sub-block of memory cells. The operation code may be issued to the local memory controller 245, which may decode the operation code and initiate the read refresh operation. During the read refresh operation, data stored to the memory cells 205 may be refreshed and/or restored. Performing read refresh operations on the memory cells 205 may prevent (e.g., mitigate) data loss and/or corruption due to programmed logic states transitioning due to a relatively low quantity of write operations being performed, may reduce overall system latency and media management complexity of the memory die 200.

Figure 3:
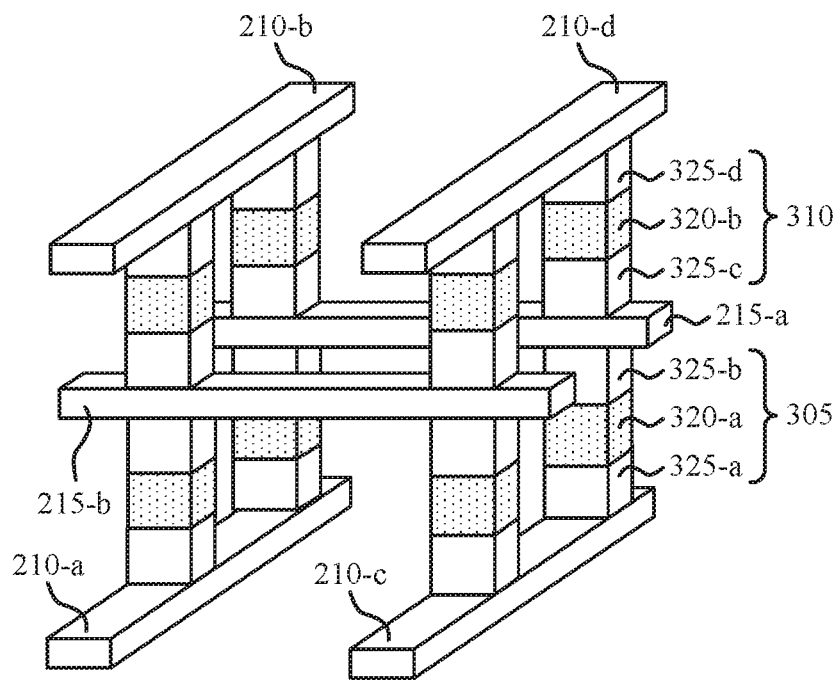
FIG. 3 illustrates an example of memory cells that support read refresh operation in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a self-selecting memory cell. In such examples, the material used in the storage element 320 may be based on an alloy (such as the alloys listed above) and may be operated so as to undergo a change to different physical state during normal operation of the memory cell. For example, a self-selecting memory cell may have a high threshold voltage state and a low threshold voltage state. A high threshold voltage state may correspond to a first logic state (e.g., a RESET state) and a low threshold voltage state may correspond to a second logic state (e.g., a SET state). When a memory cell is written to, its logic state may be reinforced such that it may be accurately detected (e.g., sensed). However, when a memory cell experiences relatively few writes over a period of time, its state may slowly shift. For example, if a memory cell is programmed to a high threshold voltage state (e.g., a RESET state) and is written relatively few times over a period of time, the memory cell may slowly shift toward a low threshold voltage. When a quantity of reads are performed over a period of time without a write operation or with relatively few write operations, errors in the data may be introduced by the shift in threshold voltage. Accordingly it may be desirable to periodically issue a read refresh command as described herein to reinforce the state of certain memory cells and mitigate the shift of the threshold voltage.

In some examples, such as for thresholding memory cells or self-selecting memory cells, some or all of the set of logic states supported by the memory cells may be associated with an amorphous state of the chalcogenide material (e.g., the material in a single state may be operable to store different logic states).

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

Figure 4A:
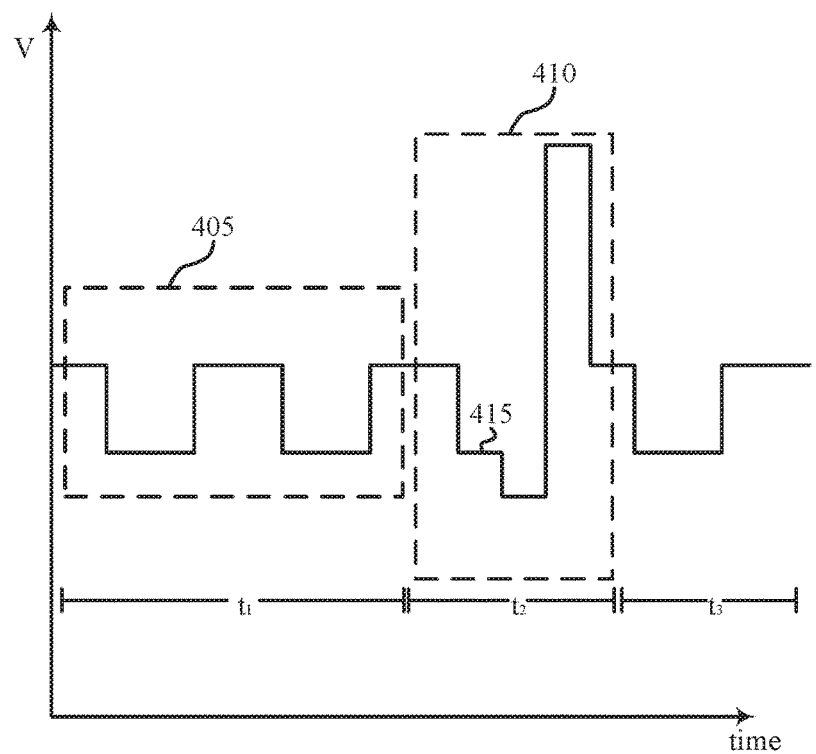
FIGS. 4A and 4B illustrate example timing diagrams that support read refresh operations in accordance with examples as disclosed herein.

FIG. 4A illustrates an example of a timing diagram 400-*a* that supports read refresh operations in accordance with examples as disclosed herein. The timing diagram 400-*a* may illustrate one or more access operations performed on a memory array. The memory array may include one or more sub-blocks, and each sub-block may contain a plurality of memory cells. Thus the timing diagram 400-*a* may illustrate an access operation performed on a memory cell of any one sub-block of memory cells. In some examples, the timing diagram 400-*a* may illustrate aspects of an access phase 405 and aspects of a read refresh operation 410. The read refresh operation 410 may illustrate timing aspects of a memory cell programmed to a first logic state (e.g., a RESET state).

In some examples, an access operation on a memory cell comprising a chalcogenide material can be described as including multiple events, including a thresholding event. When a bias is applied across a memory cell for a certain period of time, the memory cell comprising the chalcogenide material can undergo a thresholding event. A thresholding event may include a rapid increase in the amount of current flow through the memory cell and a "snap back" event, characterized by a rapid reduction in the bias across the memory cell. The thresholding event can occur in a storage node of the memory cell, a selector node of the memory cell, or both. Once thresholded, the memory cell may conduct a relatively large amount of current.

During $t_1$ an access phase 405 of one or more memory cells may occur. During the access phase 405, data may be read from or written to one or more memory cells of a sub-block. In order to access a memory cell of the sub-block, an access bias may be applied to the memory cells. As used herein, a bias applied to a memory cell refers to a voltage difference applied across the memory cell. To read the contents of a memory cell, a read access bias may be applied across the memory cell. The resulting current-voltage behavior of the memory cell may indicate its stored state. For example, the memory cell may not experience a snapback event, which may indicate that the memory cell is in a RESET state (e.g., the memory cell stores a first logic value). Additionally or alternatively, the memory cell may experience a snapback event, which may indicate that the memory cell is in a SET state (e.g., the memory cell stores a second logic value).

To write data to one or more memory cells of the sub-block, a write access bias may be applied across the memory cell. For example, a write access bias having a first polarity may be applied to a memory cell to program a RESET state. When programming a RESET state, the memory cell may experience a low-threshold-to-high-threshold transition which can occur due to a certain current (e.g., a RESET current) flowing through the memory cell. In other examples, a write access bias having a second polarity (e.g., a different polarity, an opposite polarity) may be applied to the memory cell to program a SET state. When programming a SET state, the memory cell may experience an high-threshold-to-low-threshold transition which can occur due to a current (e.g., a SET current) flowing through the memory cell.

In some examples, the access phase 405 may last for a longer (or shorter) duration than $t_1$. For example, the access phase 405 may include N access operations, where N is a positive integer. It may be beneficial to perform a read refresh operation on a sub-block of memory cells to minimize data corruption. For example, a counter (e.g., as discussed with reference to FIG. 7) may track a number of access operations performed on one or more sub-blocks of a memory device. In some cases, an individual counter may be used for each sub-block of the memory device. The counter may be used to monitor the quantity of write operations performed on the sub-block over a period of time, the quantity of read operations performed on the sub-block over the period of time, or a ratio of write operations and read operations performed over a period of time, which may allow for a read refresh operation to be periodically performed.

When a memory sub-block experiences a read operations over a period of time with relatively few write operations or refresh operations, the state of one or more memory cells of the sub-block may slowly drift. For example, each read operation performed on the sub-block may transition the memory cells programmed to an amorphous state (e.g., a RESET state) towards to a crystalline state (e.g., a SET state). That is, read operations may cause memory cells programmed to a RESET state to slowly crystalize, which may introduce errors into the data over time. Thus it may be desirable to monitor (using the counter) the quantity of read operations, a quantity of write operations, a quantity of refresh operations, ratios of those different quantities, or any combination thereof performed on a sub-block over time. If relatively few write operations have been performed on the memory cells over a period of time and/or a relatively high quantity of read operations have been performed on the memory cells over that same period of time, the sub-block may be more susceptible to drift (e.g., more susceptible to RESET states slowly transitioning to SET states). Accordingly, based on a value of the counter (e.g., after various durations), an operation code (e.g., an op-code) may be received (e.g., from a host device) to initiate a read refresh operation on the respective sub-block. Accordingly, the transition from the access phase 405 to the read refresh operation 410 as shown in FIG. 4A may occur based on a read refresh operation being initiated.

During $t_2$ a read refresh operation 410 may occur. During the read refresh operation 410, a read pulse (e.g., a first voltage) may be applied to the memory cell to determine its logic state. As shown in FIG. 4A, the memory cell may not experience a snapback event when the read pulse is applied. Rather, applying the read pulse may result in the bias across the memory cell 415 not increasing. The unchanged bias may indicate that the memory cell is programmed to a RESET state, and the read refresh operation may be performed as described with reference to FIGS. 5 and 6. Performing the read refresh operation in such a manner may prevent (e.g., mitigate) data loss and/or corruption due to programmed logic states transitioning due to a relatively low quantity of write operations being performed, may reduce the overall latency associated with the memory device, and may reduce the complexity of circuitry used to refresh the memory cells. In some examples, during $t_3$, a second access phase (e.g., a subsequent access phase) of one or more memory cells may occur.

Figure 4B:
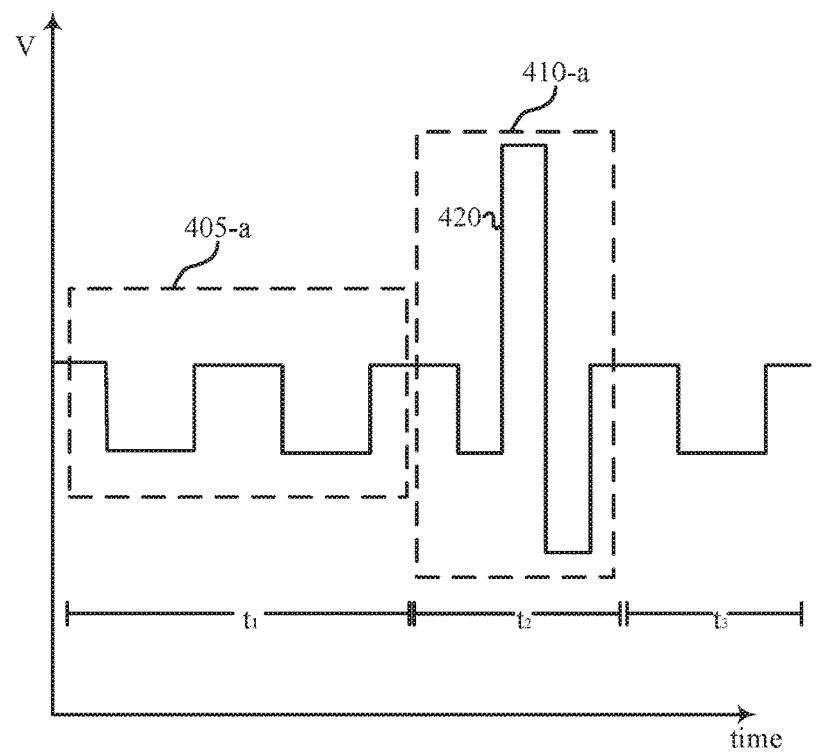

FIG. 4B illustrates an example of a timing diagram 400-*b* that supports read refresh operations in accordance with examples as disclosed herein. The timing diagram 400-*b* may illustrate one or more access operations performed on a memory array, such as the access operations described with reference to FIG. 4A. The memory array may include one or more sub-blocks, and each sub-block may contain a plurality of memory cells. Thus the timing diagram 400-*b* may illustrate an access operation performed on a memory cell of any one sub-block of memory cells. In some examples, the timing diagram 400-*b* may illustrate aspects of an access phase 405-*a* and aspects of a read refresh operation 410-*a*. The read refresh operation 410-*a* may illustrate timing aspects of a memory cell programmed to a first logic state (e.g., a SET state).

As discussed with reference to FIG. 4A, an access phase 405-*a* may occur during $t_1$. During the access phase 405-*a* one or more memory cells of a sub-block may be read from or written to by applying an access bias. To read the contents of a memory cell, a read access bias may be applied across the memory cell and the resulting current-voltage behavior of the memory cell may indicate its stored state. To write data to one or more memory cells of the sub-block, a write access bias may be applied across the memory cell to program the cell to a SET state or to a RESET state.

In some examples, the access phase 405-*a* may last for a longer (or shorter) duration than $t_1$. For example, the access phase 405-*a* may include N access operations, where N is a positive integer. As discussed herein, it may be beneficial to perform a read refresh operation on a sub-block of memory cells to minimize data corruption. For example, a counter (e.g., as discussed with reference to FIG. 7) may track a number of access operations performed on each sub-block of a memory device. When a sub-block receives a relatively large quantity of read operations during a duration, memory cells programmed to a RESET state may transition (e.g., drift) to a SET state, which may introduce undesirable errors into the data. Accordingly, the counter may track the quantity of read operations performed on any sub-block over time. When the quantity of read operations performed on the sub-block is above a threshold, it may be desirable to refresh some of the memory cells. In particular, it may be desirable to refresh the memory cells programmed to a RESET state to prevent (e.g., mitigate) the programmed states from transitioning to a SET state.

To refresh the memory cells of a sub-block, the counter may signal that a relatively small quantity of access operations were performed on the sub-block a period of time, and an operation code (e.g., an op-code) may be received (e.g., from a host device) to initiate a read refresh operation on the respective sub-block. Accordingly, the transition from the access phase 405-*a* to the read refresh operation 410-*a* as shown in FIG. 4B may occur based on a read refresh operation being initiated.

During $t_2$ a read refresh operation 410-*a* may occur. During the read refresh operation 410-*a*, a read pulse may be applied to the memory cell to determine its logic state. As shown in FIG. 4B, the memory cell may experience a snapback event when the read pulse is applied. The snapback event may be characterized by the increase of the bias 420 across the memory cell. The occurrence of the snapback event may indicate that the memory cell is programmed to a SET state. In such an example, the memory cell may be programmed to a RESET state, and then programmed (e.g., reprogrammed) to the SET state. Reprogramming the memory cell to the SET state may reinforce the data stored to the cell, which may minimize data corruption and/or data loss. In some examples, during $t_3$, a second access phase (e.g., a subsequent access phase) of one or more memory cells may occur.

In memory cells that are read more often than they are written to, a read refresh operation may be beneficial alternative to a read operation. Performing one or more dummy write operations to refresh a memory cell to a RESET state may take time and power may decrease the efficiency of the memory device. In some cases, different read refresh operations (with different opcodes) may be implemented. For example, a first read refresh operation may perform a "soft" refresh as part of a read operation when a first threshold of read operations during a time period is satisfied. In another example, a second read refresh operation may perform a "full" refresh as part of a read operation when a second threshold of read operation (e.g., higher than the first threshold) during a time period is satisfied.

Figure 5:
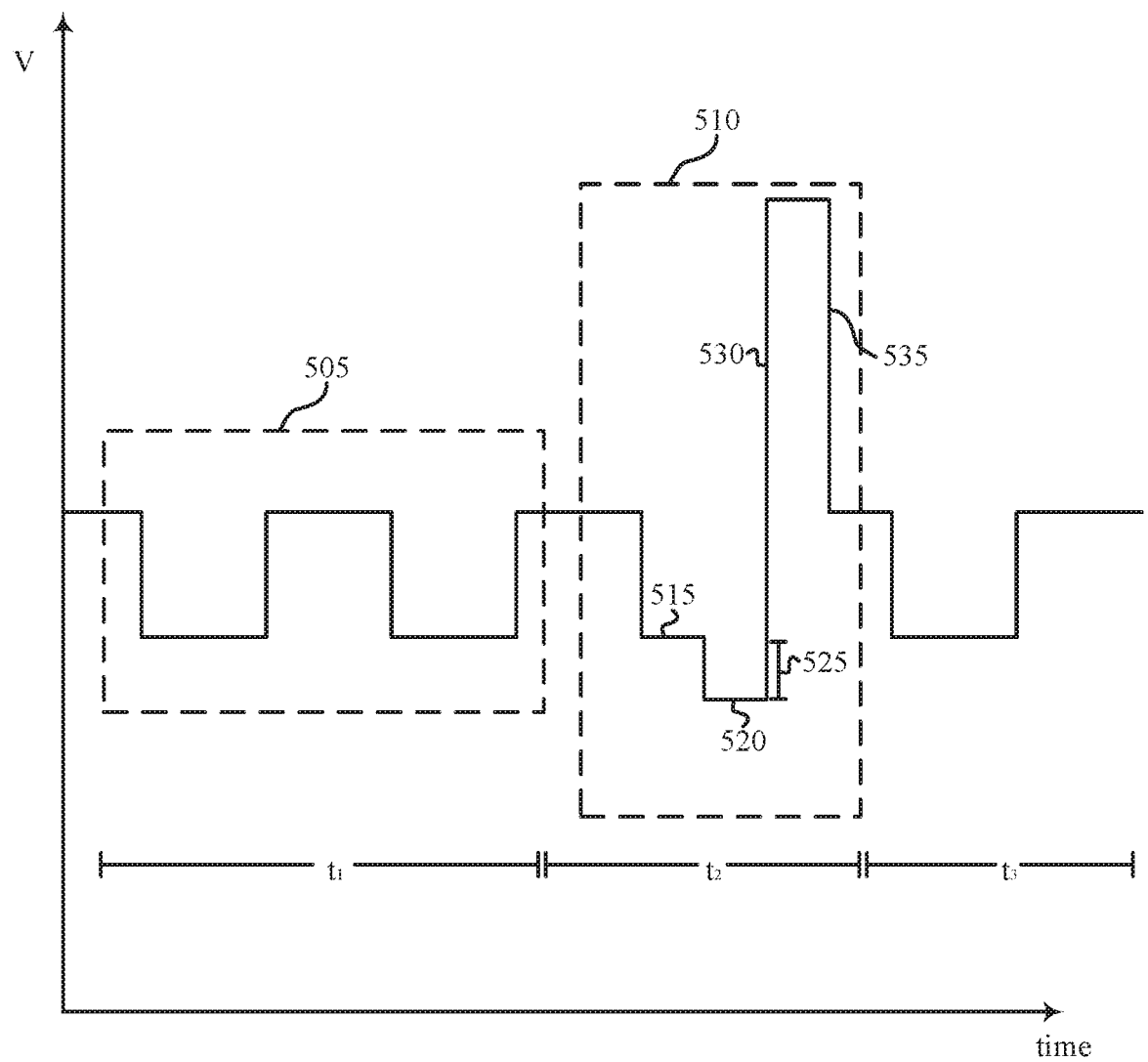
FIGS. 5 and 6 illustrate example timing diagrams that support read refresh operations in accordance with examples as disclosed herein.

FIG. 5 illustrates an example of a timing diagram 500 that supports read refresh operations in accordance with examples as disclosed herein. The timing diagram 500 may illustrate one or more access operations performed on a memory array. The memory array may include one or more sub-blocks, and each sub-block may contain a plurality of memory cells. Thus the timing diagram 500 may illustrate an access operation performed on a memory cell of any one sub-block of memory cells. In some examples, the timing diagram 500 may illustrate aspects of an access phase 505 and aspects of a read refresh operation 510. The read refresh operation 510 may be an example of a soft read refresh operation 510 performed on a memory cell that is programmed to a first logic state (e.g., a RESET state).

During $t_1$ an access phase 505 may occur. One or more memory cells of a sub-block may be read from or written to by applying an access bias during the access phase 505. To read the contents of a memory cell, a read access bias may be applied across the memory cell and the resulting current-voltage behavior of the memory cell may indicate its stored state. To write data to one or more memory cells of the sub-block, a write access bias may be applied across the memory cell to program the cell to a SET state or to a RESET state.

During $t_2$ a read refresh operation 510 may occur. The read refresh operation 510 may be initiated based on a quantity of access operations performed on the associated sub-block. As described with reference to FIG. 7, the memory device may include a counter, which is configured to track (e.g., count) the number of access operations performed on each sub-block of the memory array. After a particular duration (e.g., an hour), each sub-block that has not undergone a certain quantity of access operations may be subject to a read refresh operation. For example, any sub-block that has experienced less than a threshold quantity of access operations may undergo a read refresh operation to read and refresh the contents of each memory cell. Performing a read refresh operation may prevent (e.g., mitigate) data loss and/or corruption due to programmed logic states transitioning due to a relatively low quantity of write operations being performed, may reduce the overall latency associated with the memory device, and may reduce the complexity of circuitry used to refresh the memory cells.

In some examples, the quantity of access operations performed on a respective sub-block may trigger different read refresh operations to be performed. For example, when the quantity of read refresh operations falls below a first threshold (but above a second threshold), a first type of read refresh operation may be performed. Additionally or alternatively, when the quantity of read refresh operations falls below the second threshold, a second type of read refresh operation may be performed. The first type of read refresh operation may be referred to as a soft read refresh operation, and may be described with reference to FIG. 5.

To initiate a read refresh operation 510, the associated memory device may receive an op-code from a host device. During the read refresh operation 510, a read pulse may be applied to the memory cell to determine its logic state. As shown in FIG. 5, the memory cell may not experience a snapback event when the read pulse is applied. Rather, applying the read pulse may result in the bias 515 across the memory cell not increasing, which may indicate that the memory cell is programmed to a RESET state.

When it is determined that a memory cell is programmed to a RESET state, it may be desirable to determine whether the voltage distribution of the memory cell is undesirably high. When the voltage distribution of a memory cell programmed to RESET state increases, the likelihood data corruption increases. Accordingly, in such instances, it may be beneficial to determine the voltage distribution of the memory cell and/or reprogram (e.g., refresh) the memory cell. Accordingly, when it is determined that a memory cell is programmed to a RESET state, a second pulse (e.g., a second voltage different than the read voltage) may be applied to the memory cell which may reduce the bias 520 across the memory cell.

Applying the second pulse to the memory cell may cause the memory cell to experience a snapback event. The snapback event may be characterized by the increase of the bias 530 across the memory cell. In such instances, the occurrence of the snapback event may indicate that the voltage distribution of the memory cell is undesirably high. Thus when the snapback event occurs, a programming pulse 535 (e.g., a third voltage different than the read voltage and the second voltage) may be applied to the memory cell. The programming pulse 535 may program (e.g., reprogram) the memory cell to the RESET state, which may reduce (e.g., normalize) the voltage distribution of the memory cell. That is, reprogramming the memory cell may reduce the likelihood of data corruption and/or data loss associated with the memory cell.

In some examples, the difference between the applied voltages 525 may be configurable. For example, the difference between the applied voltages 525 may be a matter of design choice. In some examples, it may be desirable to refresh (e.g., reset) memory cells having a relatively lower or relatively higher voltage distribution. Adjusting the difference between the applied voltages 525 may result in the memory cell experiencing (or not experiencing) a snapback event based on its voltage distribution, which may result in the memory cell being refreshed or not being refreshed.

In other examples (not shown), a read pulse may be applied to the memory cell to determine its logic state. The memory cell may experience a snapback event when the read pulse is applied, which may indicate that the memory cell is programmed to a SET state. When it is determined that a memory cell is programmed to a SET state, the memory cell may not be refreshed (e.g., reprogrammed). Instead, during a soft read refresh operation 510, memory cells programmed to a SET state may not be refreshed and may remain in a same programmed SET state.

Performing a soft read refresh operation 510 may be a matter of design choice (e.g., as compared to a full read refresh operation 610 as described with reference to FIG. 6) and may be specific to the op-code received by the memory device. During a soft read refresh operation 510, if it is determined that a memory cell is programmed to a SET state, the memory cell may not be refreshed (e.g., reprogrammed). When it is determined that a memory cell is programmed to a RESET state, a RESET state may be programmed (e.g., reprogrammed) to the memory cell.

Simply reprogramming the memory cell to a RESET state may consume less time and power than a full read refresh operation. However, a soft read refresh operation 510 may not reinforce the RESET state of the memory cell as strongly as a full read refresh operation, thus soft read refresh operations may need to be performed more frequently. Because soft read refresh operations 510 may need to be performed more frequently than full read refresh operations, the duration at which the values of the counter are determined, and the quantity of write operations that may trigger a soft read refresh operation 510 may be different than for a full read refresh operation.

After a read refresh operation 510 is performed (or not performed on memory cells programmed to a SET state), the associated sub-block may resume an access phase (such as access phase 505). For example, during $t_3$ a second access phase (e.g., a subsequent access phase) of one or more memory cells may occur. The counter associated with the sub-block may be reset and a determination of whether a subsequent read refresh operation is to be performed on the sub-block may be made at a later time (e.g., during or after $t_3$).

Figure 6:
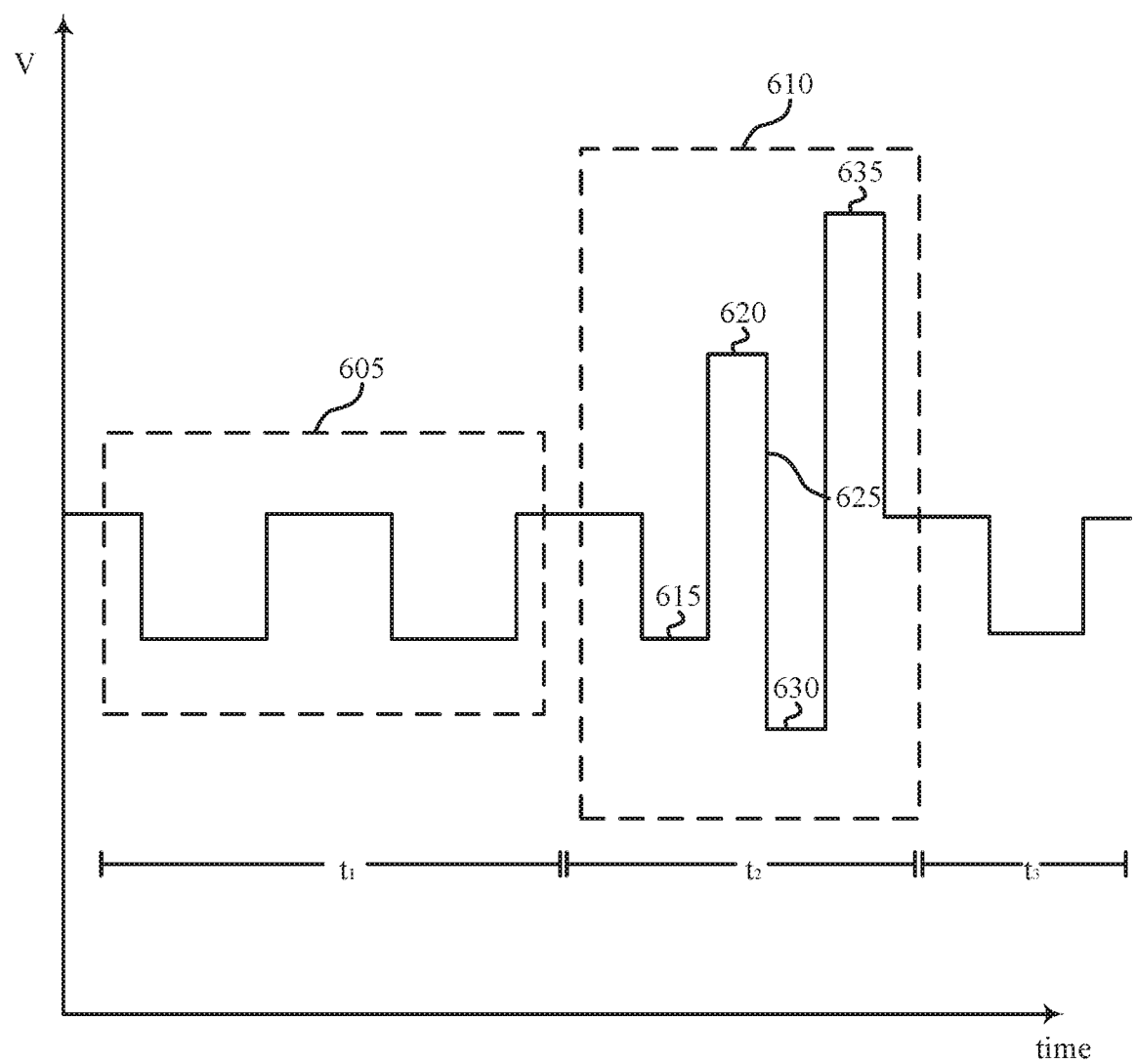

FIG. 6 illustrates an example of a timing diagram 600 that supports read refresh operations in accordance with examples as disclosed herein. The timing diagram 600 may illustrate one or more access operations performed on a memory array. The memory array may include one or more sub-blocks, and each sub-block may contain a plurality of memory cells. Thus the timing diagram 600 may illustrate an access operation performed on a memory cell of any one sub-block of memory cells. In some examples, the timing diagram 600 may illustrate aspects of an access phase 605 and aspects of a read refresh operation 610. The read refresh operation 610 may be an example of a full read refresh operation 610 performed on a memory cell that is programmed to a first logic state (e.g., a RESET state).

An access phase 605 may occur during $t_1$. During the access phase 605 one or more memory cells of a sub-block may be read from or written to by applying an access bias. To read the contents of a memory cell, a read access bias may be applied across the memory cell and the resulting current-voltage behavior of the memory cell may indicate its stored state. To write data to one or more memory cells of the sub-block, a write access bias may be applied across the memory cell to program the cell to a SET state or to a RESET state.

During $t_2$ a read refresh operation 610 may occur. The read refresh operation 610 may be initiated based on a quantity of access operations performed on the associated sub-block. As described with reference to FIG. 7, the memory device may include a counter, which is configured to track (e.g., count) the number of access operations performed on each sub-block of the memory array. After a particular duration (e.g., an hour), each sub-block that has not undergone a certain quantity of access operations may be subject to a read refresh operation. For example, any sub-block that has experienced less than a threshold quantity of access operations may undergo a read refresh operation to read and refresh the contents of each memory cell.

When a sub-block receives a relatively small quantity of access operations relative to read operations (e.g., during a duration), memory cells programmed to a RESET state may transition (e.g., drift) to a SET state, which may introduce undesirable errors into the data. Accordingly, the counter may track the quantity of write operations performed on any sub-block over time. When the quantity of write operations performed on the sub-block is undesirably low, it may be desirable to refresh some of the memory cells. In particular, it may be desirable to refresh the memory cells programmed to a RESET state to prevent (e.g., mitigate) the programmed states from transitioning to a SET state.

In some examples, the duration at which the quantity of access operations performed on each sub-block is determined may be configurable and may be a matter of design choice. Because it may be desirable to perform some read refresh operations (e.g., soft read refresh operations) more frequently than others (e.g., full read refresh operations), the quantity of access operations performed may be determined more frequently (e.g., five (5) minutes, ten (10) minutes, thirty (30) minutes, forty-five (45) minutes, sixty (60) minutes, etc.). In other examples, it may be desirable to perform some read refresh operations (e.g., full read refresh operations) less frequently than others (e.g., soft read refresh operations), thus the quantity of access operations performed may be determined less frequently (e.g., one (1), two (2), three (3) hours, etc.). Performing a read refresh operation may prevent (e.g., mitigate) data loss and/or corruption due to programmed logic states transitioning due to a relatively low quantity of write operations being performed, may reduce the overall latency associated with the memory device, and may reduce the complexity of circuitry used to refresh the memory cells.

In some examples, the quantity of access operations performed on a respective sub-block may trigger different read refresh operations to be performed. For example, when the quantity of read refresh operations falls below a first threshold (but above a second threshold), a first type of read refresh operation may be performed. Additionally or alternatively, when the quantity of read refresh operations falls below the second threshold, a second type of read refresh operation may be performed. The second type of read refresh operation may be referred to as a full read refresh operation, and may be described below with reference to FIG. 6.

Performing a full read refresh operation 610 may be a matter of design choice (e.g., as compared to a soft read refresh operation 510 as described with reference to FIG. 5) and may be specific to the op-code received by the memory device. During a full read refresh operation 610, if it is determined that a memory cell is programmed to a SET state, the memory cell may not be refreshed (e.g., reprogrammed). When it is determined that a memory cell is programmed to a RESET state, the memory cell may be programmed (e.g., temporarily programmed) to a SET state and then back to a RESET state.

Programming the memory cell to a SET state and then reprogramming the memory cell to a RESET state may consume more time and power than a soft read refresh operation. However, a full read refresh operation 610 may reinforce the RESET state of the memory cell more strongly than a soft read refresh operation, thus full read refresh operations may need to be performed less frequently. Because full read refresh operations 610 may need to be performed less frequently than soft read refresh operations, the duration at which the values of the counter are determined, and the quantity of write operations that may trigger a full read refresh operation 610 may be different than for a soft read refresh operation.

To initiate a read refresh operation 610, the associated memory device may receive one or more op-codes from a host device. During the read refresh operation 610, a first pulse (e.g., bias 615) may be applied to the memory cell to determine its logic state. As shown in FIG. 6, the memory cell may not experience a snapback event when the first pulse is applied. Rather, applying the first pulse may result in the bias across the memory cell not increasing, which may indicate that the memory cell is programmed to a RESET state.

When it is determined that a snapback event did not occur when the read pulse is applied, it may be beneficial to read the memory cell using a second pulse (e.g., bias 620) applied with a different polarity (e.g., an opposite polarity). Accordingly, a second pulse may be applied to the memory cell (and other memory cells determined to be programmed to a RESET state). Applying the second read pulse may be applied with a different polarity (e.g., an opposite polarity) may increase the bias across the memory cell. The second pulse may be the opposite polarity from the first pulse, which may, in some cases, reset the drift clock associated with the memory cell. In some examples, the second read pulse may be applied with a greater magnitude than the read pulse (and read pulses applied during the access phase 605) to minimize cell disturbance. Applying the second read pulse may cause the memory cell (and other memory cells programmed to a RESET state) to experience a snapback event. The snapback event may be characterized by the decrease of the bias across the memory cell.

When it is determined that the memory cell is programmed to a RESET state, the memory cell may be temporarily programmed to the SET state. To program the memory cell to the SET state, a third pulse (e.g., bias 630) may be applied to the memory cell (and other memory that experienced the snapback event). The third pulse may be applied with a different polarity (e.g., an opposite polarity) than the second pulse. In some examples, the third pulse may be applied with a same polarity as the first pulse. Applying the third pulse to program the memory cell to the SET state may reduce the bias 630 across the memory cell. In some cases, the bias 630 may program the memory cell to the SET state, which may refresh the memory cell from the state that occurred from an accumulation of read operations of a duration of time.

After programming the memory cell to the SET state, it may be desirable to program (reprogram) the memory cell to the RESET state to complete the full read refresh operation 610. Accordingly, after programming the memory cell to the SET state, a fourth pulse (e.g., bias 635) may be applied to the memory cell which may increase the bias across the memory cell. The fourth pulse may program (e.g., reprogram) the memory cell to the RESET state, which may reduce (e.g., normalize) the voltage distribution of the memory cell. That is, reprogramming the memory cell may reduce the likelihood of data corruption and/or data loss associated with the memory cell.

In other examples, a read pulse may be applied to the memory cell to determine its logic state. The memory cell may experience a snapback event when the read pulse is applied, which may indicate that the memory cell is programmed to a SET state. When it is determined that a memory cell is programmed to a SET state, the memory cell may not be refreshed (e.g., reprogrammed). Instead, during a full read refresh operation 610, memory cells programmed to a SET state may not be refreshed and may remain in a same programmed SET state.

In other examples, a read pulse may be applied to the memory cell to determine its logic state. The memory cell may experience a snapback event when the read pulse is applied, which may indicate that the memory cell is programmed to a SET state. When it is determined that a memory cell is programmed to a SET state, a programming pulse (e.g., a first programming pulse) may be applied to program the memory cell to the RESET state, followed by a programming pulse (e.g., a second programming pulse) to program (e.g., reprogram) the memory cell to the SET state. Refreshing the memory cell that is programmed to a SET state may reduce the likelihood of data corruption and/or data loss associated with the memory cell.

After a read refresh operation 610 is performed (or not performed on memory cells programmed to a SET state), the associated sub-block may resume an access phase (such as access phase 605). For example, during $t_3$ a second access phase (e.g., a subsequent access phase) of one or more memory cells may occur. The counter associated with the sub-block may be reset and a determination of whether a subsequent read refresh operation is to be performed on the sub-block may be made at a later time (e.g., during or after $t_3$).

Figure 7:
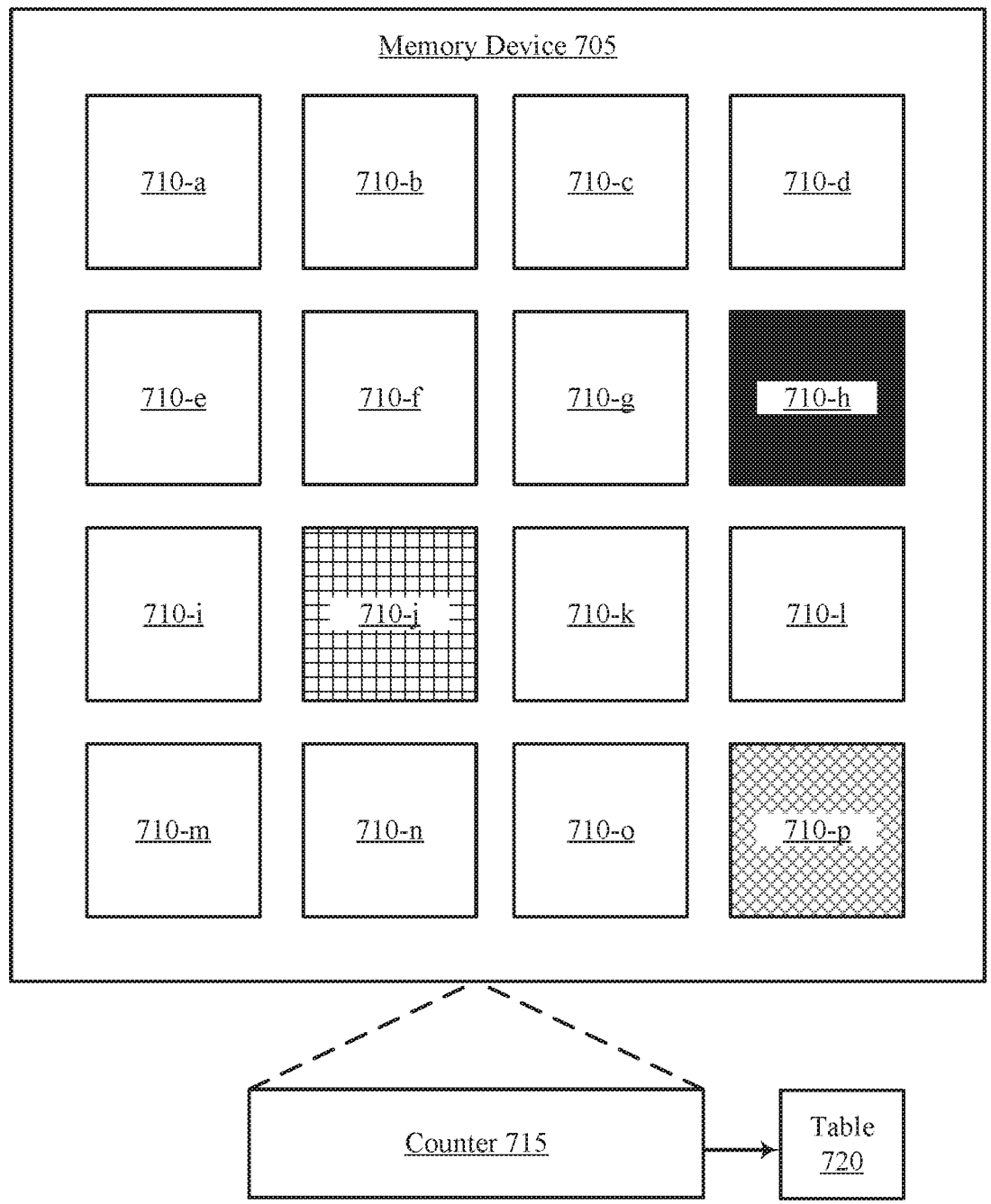
FIG. 7 illustrates an example of a memory system that supports read refresh operations in accordance with examples as disclosed herein.

FIG. 7 illustrates an example of a memory system 700 that supports read refresh operations in accordance with examples as disclosed herein. The memory system 700 may include a memory device 705 that includes a plurality of memory cells. The memory cells may be subdivided into sub-blocks 710 (e.g., sub-blocks of memory cells). For example, the memory device 705 may include a quantity of memory cells that are subdivided into sub-blocks 710-*a* through 710-*p*. The memory device 705 may include or may be coupled with a counter 715 that is configured to track a quantity of access operations (e.g., a quantity of write operations) performed on the sub-blocks 710. The counter 715 may include or may be coupled with a table 720 configured to track (e.g., store) the quantity of access operations performed on each sub-block 710 over a period of time. Based on a quantity of access operations performed on any one sub-block 710, a read refresh operation may be performed on the associated sub-block 710.

The counter 715 may be configured to track a number of access operations performed on the sub-blocks 710 of the memory device 705 over a period of time. For example, the counter 715 may track access operations performed on each of sub-blocks 710-*a* through 710-*p*. Each time a memory cell of a sub-block 710 is accessed (e.g., written to), the counter 715 may increment a value associated with the respective sub-block. Furthermore, at a predefined time period, the counter 715 may store the tracked number of access operations to the table 720. For example, the counter 715 may transfer the tracked number of access operations of each sub-block 710 to the table 720 every one second (1s). The time at which the counter 715 stores the tracked number of access operations of each sub-block 710 to the table 720 may be configurable. In some examples, the time may be set based on whether the memory device 705 is configured to receive soft read refresh commands, full read refresh commands, or both as discussed with reference to FIGS. 5 and 6.

The tracked number of access operations of each sub-block 710 stored to the table 720 may be used when determining to perform a read refresh operation on any one sub-block 710. As discussed herein, a read refresh operation may be performed on a sub-block 710 based on the number of access operations being relatively low over a period of time. For example, the contents of the table 720 may be provided to a device (e.g., a memory controller or a host device) every hour. If certain sub-blocks 710 have not experienced a threshold number of access operations (e.g., write operations) in the prior hour, an operation code for performing a read refresh operation may be transmitted to the memory device 705 (e.g., from a memory controller or a host device). The time at which the contents of the table 720 are provided to a device may be configurable.

In some examples, the threshold for performing a soft read refresh operation (e.g., as described with reference to FIG. 5) may be different than a threshold for performing a full read refresh operation (e.g., as described with reference to FIG. 6). For example, the threshold for performing a full read refresh operation may be lower than for performing a soft read refresh operation. Thus full read refresh operations may be performed on any sub-blocks 710 that do not meet a first threshold number of access operations (e.g., a relatively lower threshold), and a soft read refresh operation may be performed on any sub-blocks 710 that exceed the first threshold number of access operations but do not meet a second threshold of access operations (e.g., a relatively higher threshold than the first threshold). In some examples, the operation code transmitted to the memory device 705 may indicate which read refresh operation is to be performed and may be based on the number of access operations stored to the table 720.

The counter 715 may track and the table 720 may independently store the number of access operations associated with SET states and RESET states. For example, it may be desirable to perform read refresh operations on RESET cells more frequently than SET cells to minimize data corruption and/or data loss. Thus, entries in the table 720 associated with RESET operations may be provided to a device (e.g., a memory controller or a host device) more frequently than the entries in the table 720 associated with SET operations. The threshold values for performing soft read refresh operations and full read refresh operations for SET states and RESET states may be independently configurable.

When a full read refresh operation is performed on a sub-block 710, the associated entry in the table 720 may be reset. For example, a full read refresh operation may be performed on sub-block 710-*h*. Upon performing the read refresh operation, the table entry associated with sub-block 710-*h* may be reset (e.g., reset to zero (0)). Additionally or alternatively, when a soft read refresh operation is performed on a sub-block 710, the associated entry in the table 720 may be reset or reduced. For example, a soft read refresh operation may be performed on sub-block 710-*j*. Upon performing the read refresh operation, the table entry associated with sub-block 710-*j* may be reset (e.g., reset to zero (0)) or may be reduced to a lower value (e.g., a preconfigured value).

By way of example, a plurality of access operations may be performed on the sub-blocks 710 of the memory device 705. Each time a write operation is performed on a respective sub-block 710, the counter 715 may increment a value associated with the accessed sub-block. Every one second (1s), the contents of the counter 715 may be stored to the table. After one hour (1 hr) of access operations, the contents of the table 720 may be transmitted to a host device. The contents of the table may show, for example, that sub-blocks 710-*h*, 710-*j*, and 710-*p* experienced a relatively low number of write operations. For example, sub-block 710-*h* may have experienced one hundred (100) write operations, sub-block 710-*j* may have experienced one thousand (1000) write operations, and sub-block 710-*p* may have experienced ten thousand (10000) write operations. Other sub-blocks (in some cases, all other sub-blocks) may have experienced a relatively normal quantity of write operations during the hour (e.g., 15E3 write operations per sub-block 710).

In this example, the threshold for performing a full read refresh operation may be less than two thousand (2000) write operations, and the threshold for performing a soft read refresh operation may be greater than two thousand (2000) write operations but below twenty thousand (20000) write operations. Accordingly, a full read refresh operation may be performed on sub-block 710-*h* and sub-block 710-*j* based on an operation code received by the memory device 705. After performing the full read refresh operation, the associated entries in the table 720 may be reset to zero (0).

Additionally or alternatively, a soft read refresh operation may be performed on sub-block 710-*p* based on an operation code received by the memory device 705. This operation code may be different than an operation code received to perform the read refresh operation on sub-block 710-*h* and sub-block 710-*j*. After performing the soft read refresh operation, the associated entry in the table 720 may be reduced to five thousand (5000). Access operations may then resume being performed on the memory device 705 and, after a subsequent hour (1 hr), the contents of the table 720 may be transmitted to a host device. Performing read refresh operations in such a manner may minimize data corruption and/or data loss of the sub-blocks 710 of the memory device 705.

Figure 8:
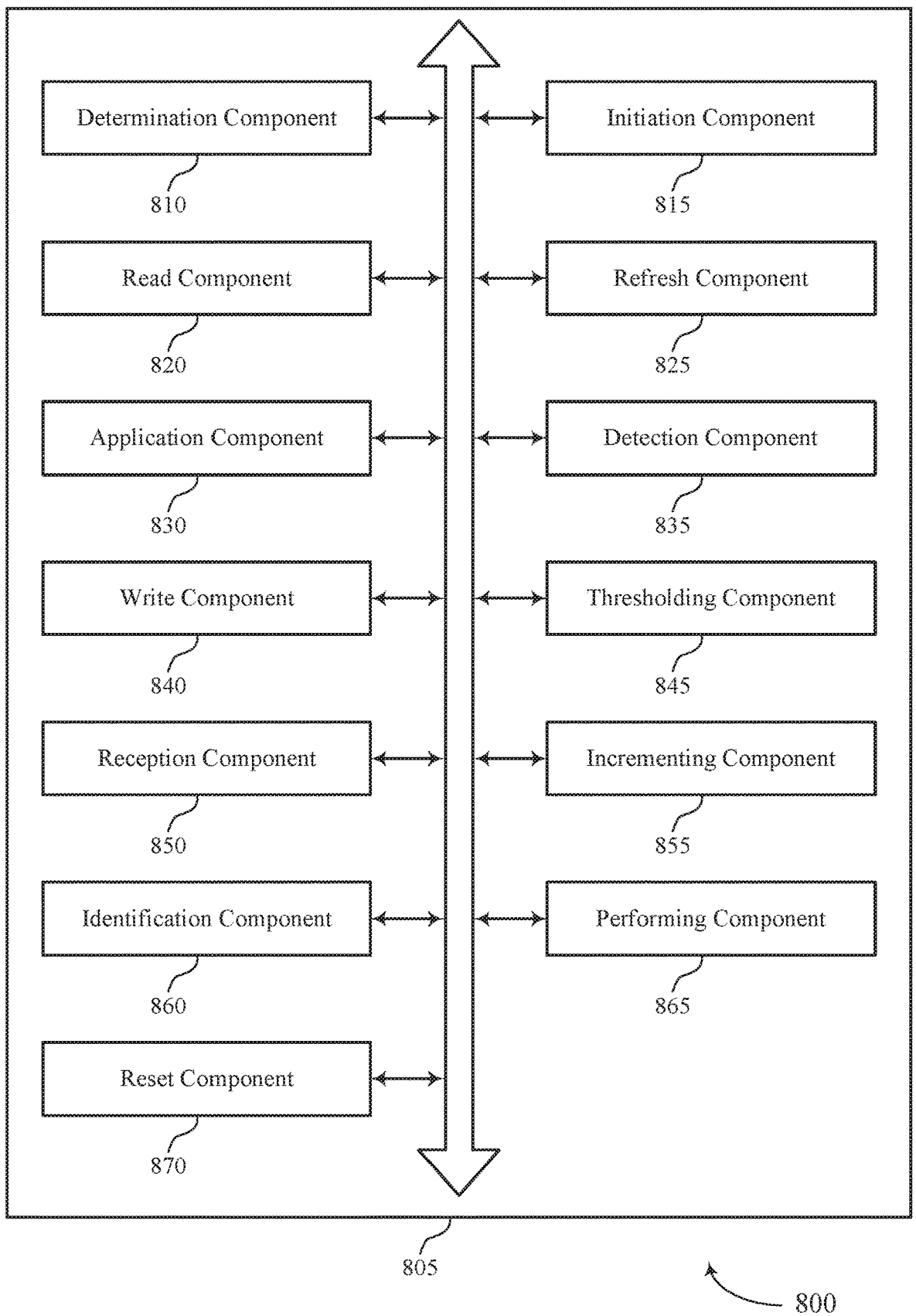
FIG. 8 shows a block diagram of a memory device that supports read refresh operations in accordance with examples as disclosed herein.

FIG. 8 shows a block diagram 800 of a memory device 805 that supports read refresh operations in accordance with examples as disclosed herein. The memory device 805 may be an example of aspects of a memory device as described with reference to FIGS. 4 through 7. The memory device 805 may include a determination component 810, an initiation component 815, a read component 820, a refresh component 825, an application component 830, a detection component 835, a write component 840, a thresholding component 845, a reception component 850, an incrementing component 855, an identification component 860, a performing component 865, and a reset component 870. Each of these modules may communicate, directly or indirectly, with one another (e.g., via one or more buses).

The determination component 810 may determine a quantity of access operations performed on a sub-block of a memory array, the sub-block including a set of memory cells including a chalcogenide storage element. In some examples, the determination component 810 may determine to perform a first read refresh operation associated with a first threshold or a second read refresh operation associated with a second threshold on a sub-block of the set of sub-blocks based on the quantity of access operations performed on the sub-block. In some examples, the determination component 810 may determine whether a snapback event associated with the at least one memory cell occurs based on applying the first voltage.

The initiation component 815 may initiate a read refresh operation for the sub-block based on determining the quantity of access operations performed on the sub-block.

The read component 820 may read, as part of the read refresh operation, a logic state of at least one memory cell of the sub-block based on initiating the read refresh operation. In some examples, the read component 820 may read a first logic state from at least one memory cell of the sub-block. In some examples, reading the first logic state includes applying a first voltage having a first magnitude and a first polarity to the at least one memory cell of the sub-block. In some examples, reading the first logic state includes applying a third voltage having a first polarity to the at least one memory cell of the sub-block. In some cases, the read refresh operation includes a single operation to read the logic state of the at least one memory cell of the sub-block.

The refresh component 825 may refreshing, as part of the read refresh operation, the at least one memory cell of the sub-block based on the logic state. In some examples, the refresh component 825 may refrain from refreshing the at least one memory cell of the sub-block based on detecting the snapback event after applying the first voltage.

The application component 830 may apply a first voltage having a first magnitude to the at least one memory cell based on reading the logic state of the at least one memory cell. In some examples, the application component 830 may apply a second voltage to the at least one memory cell of the sub-block having a second magnitude greater than the first magnitude of the first voltage based on a snapback event not occurring after applying the first voltage. In some examples, the application component 830 may apply a third voltage having a third magnitude and a first polarity different than a second polarity of the first voltage and the second voltage to the at least one memory cell based on detecting the snapback event associated with applying the second voltage.

In some examples, the application component 830 may apply a first voltage having a first magnitude to the at least one memory cell based on reading the logic state of the at least one memory cell. In some examples, the application component 830 may apply a first voltage having a first magnitude to the at least one memory cell based on reading the logic state of the at least one memory cell. In some examples, the application component 830 may apply a first voltage having a first magnitude and a first polarity to the at least one memory cell to determine whether the at least one memory cell stores a second logic state based on reading the logic state of the at least one memory cell.

In some examples, the application component 830 may apply a second voltage having a second magnitude and a second polarity to the at least one memory cell to threshold the at least one memory cell towards the first logic state based on a snapback event not occurring after applying the first voltage. In some examples, the application component 830 may apply a third voltage having a third magnitude and the first polarity to the at least one memory cell of the sub-block to write the second logic state to the at least one memory cell based on applying the second voltage. In some examples, the application component 830 may apply a fourth voltage having a fourth magnitude and the second polarity to the at least one memory cell of the sub-block to write the logic state to the at least one memory cell based on applying the fourth voltage. In some examples, the application component 830 may apply a first voltage to the at least one memory cell of the sub-block.

The detection component 835 may detect the snapback event associated with the at least one memory cell occurs based on applying the second voltage, where refreshing the at least one memory cell of the sub-block is based on detecting the snapback event. In some examples, the detection component 835 may detect a snapback event associated with the at least one memory cell occurs based on applying the first voltage.

The write component 840 may rewrite the logic state to the at least one memory cell of the sub-block using a third voltage that has a different polarity than the first voltage and the second voltage based on detecting the snapback event associated with applying the second voltage. In some examples, the write component 840 may write a second logic state different than the logic state to the at least one memory cell of the sub-block based on reading the logic state from the at least one memory cell of the sub-block.

In some examples, the write component 840 may write the logic state to the at least one memory cell of the sub-block based on writing the second logic state to the at least one memory cell of the sub-block. In some examples, the write component 840 may write the first logic state to the at least one memory cell after reading the first logic state from the at least one memory cell. In some examples, writing the first logic state includes applying a second voltage having a second magnitude and a second polarity that is different than the first polarity to the at least one memory cell of the sub-block.

In some examples, writing the second logic state includes applying a fourth voltage having a second polarity that is different than the first polarity to the at least one memory cell of the sub-block. In some examples, writing the first logic state includes applying a fifth voltage having the first polarity to the at least one memory cell of the sub-block. In some examples, the write component 840 may write the first logic state to the at least one memory cell of the sub-block occurs before writing the second logic state to the at least one memory cell of the sub-block.

The thresholding component 845 may threshold the at least one memory cell of the sub-block towards the first logic state based on a snapback event not occurring after applying the first voltage, where writing the second logic state is based on thresholding the at least one memory cell of the sub-block.

The reception component 850 may receive an operation code to initiate the read refresh operation based on the quantity of access operations performed on the sub-block. In some examples, the reception component 850 may receive, from a host device, a first operation code to perform a first type of read refresh operation based on a first quantity of access operations performed on the sub-block over a first duration of time satisfying a first threshold.

In some examples, the reception component 850 may receive, from the host device, a second operation code to perform a second type of read refresh operation based on a second quantity of access operations performed on the sub-block over a second duration of time satisfying a second threshold. In some examples, the reception component 850 may receive a first operation code configured to initiate the first read refresh operation and. In some examples, the reception component 850 may receive a second operation code configured to initiate the second read refresh operation based on the quantity of access operations performed on the sub-block.

The incrementing component 855 may increment a counter based on an access operation being performed on the sub-block, where the read refresh operation is performed based at least in part a value of the counter not exceeding a threshold value. In some examples, the incrementing component 855 may increment a value stored to a counter table associated with the at least one of the set of sub-blocks based on performing the access operation, where the counter table is configured to track the quantity of access operations performed on each sub-block of the memory array.

The identification component 860 may identify a quantity of access operations performed on each of a set of sub-blocks of a memory array, each sub-block including a set of memory cells including a chalcogenide storage element. In some examples, the identification component 860 may identify, based on the value of the counter table, the quantity of access operations performed on each of the set of sub-blocks of the memory array at a periodic rate. In some examples, the identification component 860 may identify a lowest value of the counter table based on performing the access operation on the at least one of the set of sub-blocks of the memory array.

The performing component 865 may perform the first read refresh operation on the sub-block based on the quantity of access operations performed on the sub-block satisfying the first threshold and failing to satisfy the second threshold. In some examples, the performing component 865 may perform an access operation on at least one of the set of sub-blocks of the memory array. In some examples, the performing component 865 may perform the first read refresh operation on a sub-block associated with the lowest value of the counter table. In some cases, performing the second read refresh operation on the sub-block may be based on the quantity of access operations performed on the sub-block failing to satisfy the second threshold that is lower than the first threshold. The second read refresh operation may include reading a first logic state from of at least one memory cell of the sub-block, writing a second logic state to the at least one memory cell of the sub-block after reading the first logic state, and writing the first logic state to the at least one memory cell of the sub-block after reading the first logic state.

The reset component 870 may reset a respective value of the counter table based on performing the first read refresh operation or the second read refresh operation on the associated sub-block.

Figure 9:
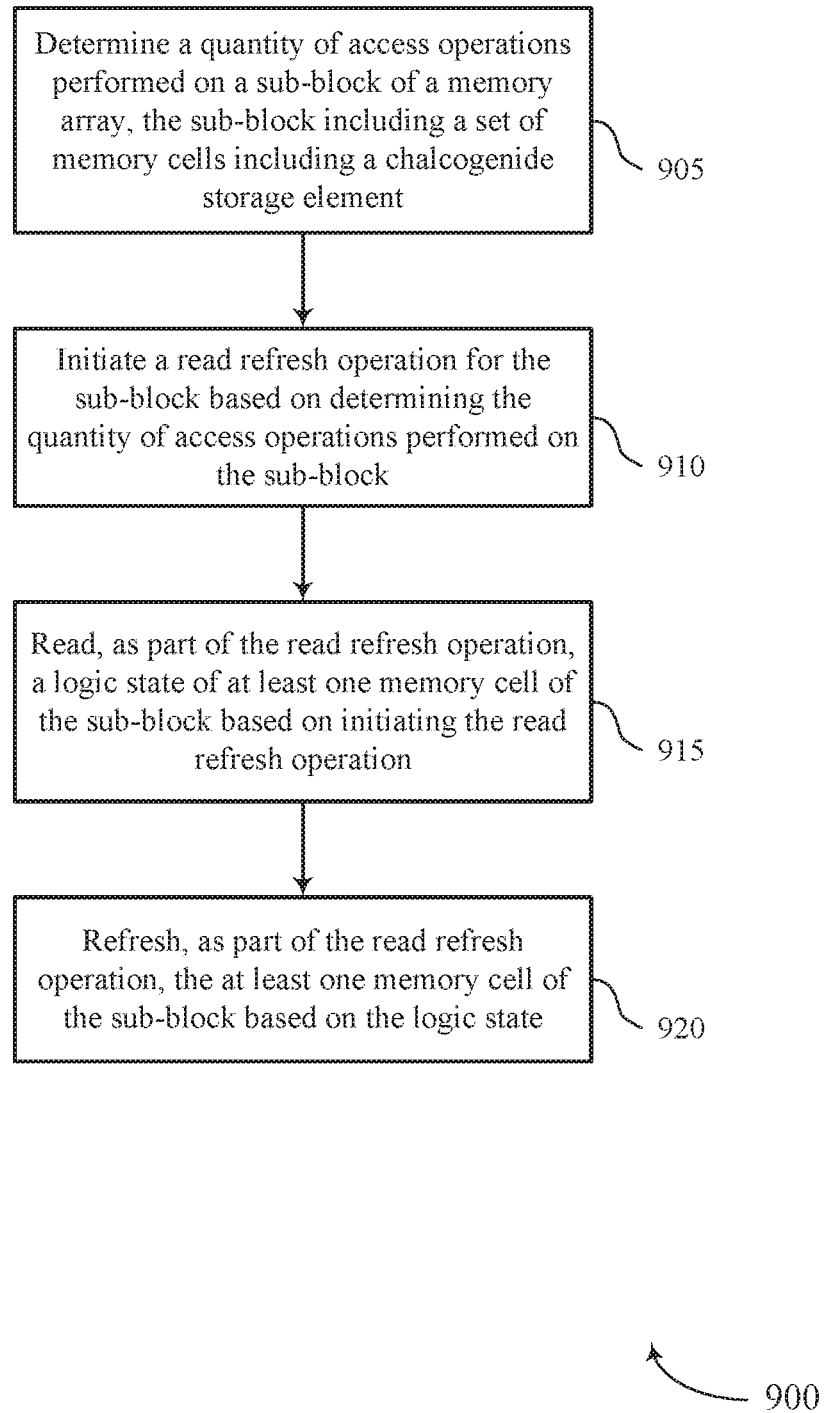
FIGS. 9 and 10 show flowcharts illustrating a method or methods that support read refresh operation in accordance with examples as disclosed herein.

FIG. 9 shows a flowchart illustrating a method or methods 900 that supports read refresh operations in accordance with examples as disclosed herein. The operations of method 900 may be implemented by a memory device or its components as described herein. For example, the operations of method 900 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 905, the memory device may determine a quantity of access operations performed on a sub-block of a memory array, the sub-block including a set of memory cells including a chalcogenide storage element. The operations of 905 may be performed according to the methods described herein. In some examples, aspects of the operations of 905 may be performed by a determination component as described with reference to FIG. 8.

At 910, the memory device may initiate a read refresh operation for the sub-block based on determining the quantity of access operations performed on the sub-block. The operations of 910 may be performed according to the methods described herein. In some examples, aspects of the operations of 910 may be performed by an initiation component as described with reference to FIG. 8.

At 915, the memory device may read, as part of the read refresh operation, a logic state of at least one memory cell of the sub-block based on initiating the read refresh operation. The operations of 915 may be performed according to the methods described herein. In some examples, aspects of the operations of 915 may be performed by a read component as described with reference to FIG. 8.

At 920, the memory device may refresh, as part of the read refresh operation, the at least one memory cell of the sub-block based on the logic state. The operations of 920 may be performed according to the methods described herein. In some examples, aspects of the operations of 920 may be performed by a refresh component as described with reference to FIG. 8.

In some examples, an apparatus as described herein may perform a method or methods, such as the method 900. The apparatus may include features, means, or instructions (e.g., a non-transitory computer-readable medium storing instructions executable by a processor) for determining a quantity of access operations performed on a sub-block of a memory array, the sub-block including a set of memory cells including a chalcogenide storage element, initiating a read refresh operation for the sub-block based on determining the quantity of access operations performed on the sub-block, reading, as part of the read refresh operation, a logic state of at least one memory cell of the sub-block based on initiating the read refresh operation, and refreshing, as part of the read refresh operation, the at least one memory cell of the sub-block based on the logic state.

Some examples of the method 900 and the apparatus described herein may further include operations, features, means, or instructions for applying a first voltage having a first magnitude to the at least one memory cell based on reading the logic state of the at least one memory cell, applying a second voltage to the at least one memory cell of the sub-block having a second magnitude greater than the first magnitude of the first voltage based on a snapback event not occurring after applying the first voltage, and detecting the snapback event associated with the at least one memory cell occurs based on applying the second voltage, where refreshing the at least one memory cell of the sub-block may be based on detecting the snapback event.

In some examples of the method 900 and the apparatus described herein, refreshing the at least one memory cell of the sub-block may include operations, features, means, or instructions for rewriting the logic state to the at least one memory cell of the sub-block using a third voltage that has a different polarity than the first voltage and the second voltage based on detecting the snapback event associated with applying the second voltage.

In some examples of the method 900 and the apparatus described herein, refreshing the at least one memory cell of the sub-block may include operations, features, means, or instructions for applying a third voltage having a third magnitude and a first polarity different than a second polarity of the first voltage and the second voltage to the at least one memory cell based on detecting the snapback event associated with applying the second voltage.

Some examples of the method 900 and the apparatus described herein may further include operations, features, means, or instructions for applying a first voltage having a first magnitude to the at least one memory cell based on reading the logic state of the at least one memory cell, detecting a snapback event associated with the at least one memory cell occurs based on applying the first voltage, and refraining from refreshing the at least one memory cell of the sub-block based on detecting the snapback event after applying the first voltage.

Some examples of the method 900 and the apparatus described herein may further include operations, features, means, or instructions for writing a second logic state different than the logic state to the at least one memory cell of the sub-block based on reading the logic state from the at least one memory cell of the sub-block, and writing the logic state to the at least one memory cell of the sub-block based on writing the second logic state to the at least one memory cell of the sub-block.

Some examples of the method 900 and the apparatus described herein may further include operations, features, means, or instructions for applying a first voltage having a first magnitude to the at least one memory cell based on reading the logic state of the at least one memory cell, and thresholding the at least one memory cell of the sub-block based on a snapback event not occurring after applying the first voltage, where writing the second logic state may be based on thresholding the at least one memory cell of the sub-block.

In some examples of the method 900 and the apparatus described herein, thresholding the at least one memory cell of the sub-block may include operations, features, means, or instructions for applying a first voltage having a first magnitude and a first polarity to the at least one memory cell to determine whether the at least one memory cell stores a second logic state based on reading the logic state of the at least one memory cell, applying a second voltage having a second magnitude and a second polarity to the at least one memory cell to threshold the at least one memory cell towards the first logic state based on a snapback event not occurring after applying the first voltage, applying a third voltage having a third magnitude and the first polarity to the at least one memory cell of the sub-block to write the second logic state to the at least one memory cell based on applying the second voltage, and applying a fourth voltage having a fourth magnitude and the second polarity to the at least one memory cell of the sub-block to write the logic state to the at least one memory cell based on applying the fourth voltage.

In some examples of the method 900 and the apparatus described herein, reading the logic state of the at least one memory cell of the sub-block may include operations, features, means, or instructions for applying a first voltage to the at least one memory cell of the sub-block, and determining whether a snapback event associated with the at least one memory cell occurs based on applying the first voltage.

Some examples of the method 900 and the apparatus described herein may further include operations, features, means, or instructions for receiving an operation code to initiate the read refresh operation based on the quantity of access operations performed on the sub-block.

In some examples of the method 900 and the apparatus described herein, the read refresh operation includes a single operation to read the logic state of the at least one memory cell of the sub-block.

Some examples of the method 900 and the apparatus described herein may further include operations, features, means, or instructions for receiving, from a host device, a first operation code to perform a first type of read refresh operation based on a first quantity of access operations performed on the sub-block over a first duration of time satisfying a first threshold, and receiving, from the host device, a second operation code to perform a second type of read refresh operation based on a second quantity of access operations performed on the sub-block over a second duration of time satisfying a second threshold.

Some examples of the method 900 and the apparatus described herein may further include operations, features, means, or instructions for incrementing a counter based on an access operation being performed on the sub-block, where the read refresh operation may be performed based at least in part a value of the counter not exceeding a threshold value.

Figure 10:
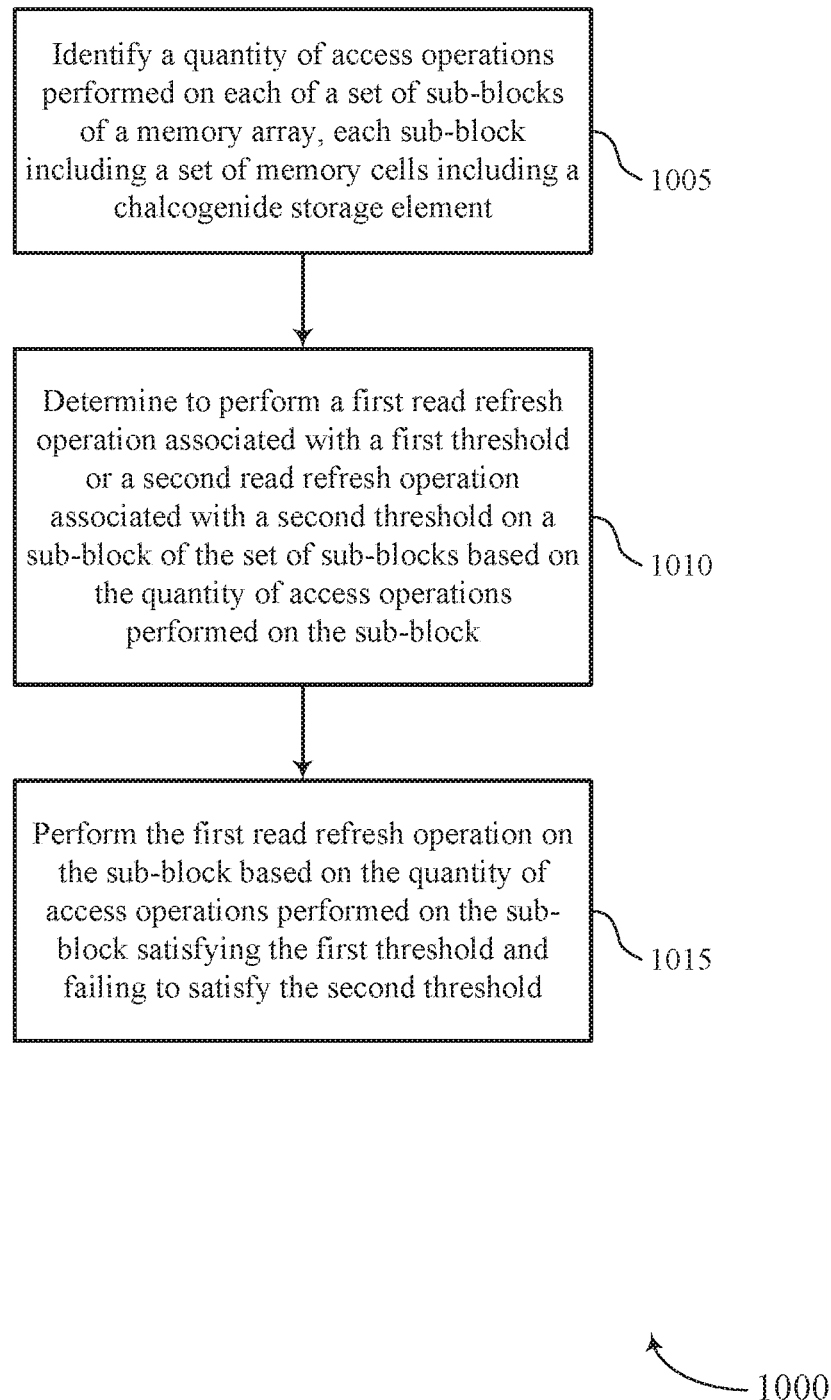

FIG. 10 shows a flowchart illustrating a method or methods 1000 that supports read refresh operations in accordance with examples as disclosed herein. The operations of method 1000 may be implemented by a memory device or its components as described herein. For example, the operations of method 1000 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1005, the memory device may identify a quantity of access operations performed on each of a set of sub-blocks of a memory array, each sub-block including a set of memory cells including a chalcogenide storage element. The operations of 1005 may be performed according to the methods described herein. In some examples, aspects of the operations of 1005 may be performed by an identification component as described with reference to FIG. 8.

At 1010, the memory device may determine to perform a first read refresh operation associated with a first threshold or a second read refresh operation associated with a second threshold on a sub-block of the set of sub-blocks based on the quantity of access operations performed on the sub-block. The operations of 1010 may be performed according to the methods described herein. In some examples, aspects of the operations of 1010 may be performed by a determination component as described with reference to FIG. 8.

At 1015, the memory device may perform the first read refresh operation on the sub-block based on the quantity of access operations performed on the sub-block satisfying the first threshold and failing to satisfy the second threshold. The operations of 1015 may be performed according to the methods described herein. In some examples, aspects of the operations of 1015 may be performed by a performing component as described with reference to FIG. 8.

In some examples, an apparatus as described herein may perform a method or methods, such as the method 1000. The apparatus may include features, means, or instructions (e.g., a non-transitory computer-readable medium storing instructions executable by a processor) for identifying a quantity of access operations performed on each of a set of sub-blocks of a memory array, each sub-block including a set of memory cells including a chalcogenide storage element, determining to perform a first read refresh operation associated with a first threshold or a second read refresh operation associated with a second threshold on a sub-block of the set of sub-blocks based on the quantity of access operations performed on the sub-block, and performing the first read refresh operation on the sub-block based on the quantity of access operations performed on the sub-block satisfying the first threshold and failing to satisfy the second threshold.

In some examples of the method 1000 and the apparatus described herein, the first read refresh operation may include operations, features, means, or instructions for reading a first logic state from at least one memory cell of the sub-block, and writing the first logic state to the at least one memory cell after reading the first logic state from the at least one memory cell.

In some examples of the method 1000 and the apparatus described herein, reading the first logic state may include operations, features, means, or instructions for applying a first voltage having a first magnitude and a first polarity to the at least one memory cell of the sub-block, and writing the first logic state may include operations, features, means, or instructions for applying a second voltage having a second magnitude and a second polarity that may be different than the first polarity to the at least one memory cell of the sub-block.

Some examples of the method 1000 and the apparatus described herein may further include operations, features, means, or instructions for performing the second read refresh operation on the sub-block based on the quantity of access operations performed on the sub-block failing to satisfy the second threshold that may be lower than the first threshold, where the second read refresh operation includes.

In some examples of the method 1000 and the apparatus described herein, reading the first logic state may include operations, features, means, or instructions for applying a third voltage having a first polarity to the at least one memory cell of the sub-block, writing the second logic state may include operations, features, means, or instructions for applying a fourth voltage having a second polarity that may be different than the first polarity to the at least one memory cell of the sub-block, and writing the first logic state may include operations, features, means, or instructions for applying a fifth voltage having the first polarity to the at least one memory cell of the sub-block.

Some examples of the method 1000 and the apparatus described herein may further include operations, features, means, or instructions for writing the first logic state to the at least one memory cell of the sub-block occurs before writing the second logic state to the at least one memory cell of the sub-block.

Some examples of the method 1000 and the apparatus described herein may further include operations, features, means, or instructions for receiving a first operation code configured to initiate the first read refresh operation and, and receiving a second operation code configured to initiate the second read refresh operation based on the quantity of access operations performed on the sub-block.

Some examples of the method 1000 and the apparatus described herein may further include operations, features, means, or instructions for performing a access operation on at least one of the set of sub-blocks of the memory array, and incrementing a value stored to a counter table associated with the at least one of the set of sub-blocks based on performing the access operation, where the counter table may be configured to track the quantity of access operations performed on each sub-block of the memory array.

Some examples of the method 1000 and the apparatus described herein may further include operations, features, means, or instructions for identifying, based on the value of the counter table, the quantity of access operations performed on each of the set of sub-blocks of the memory array at a periodic rate, and resetting a respective value of the counter table based on performing the first read refresh operation or the second read refresh operation on the associated sub-block.

Some examples of the method 1000 and the apparatus described herein may further include operations, features, means, or instructions for identifying a lowest value of the counter table based on performing the access operation on the at least one of the set of sub-blocks of the memory array, and performing the first read refresh operation on a sub-block associated with the lowest value of the counter table.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array including a set of sub-blocks, each sub-block including a set of memory cells that each include a chalcogenide storage element, a controller coupled with the memory array, the controller operable to, initiate a read refresh operation for the sub-block based on determining the quantity of access operations performed on the sub-block, read, as part of the read refresh operation, a logic state of at least one memory cell of the sub-block based on initiating the read refresh operation, and refresh, as part of the read refresh operation, the at least one memory cell of the sub-block based on the logic state.

Some examples may further include reading a first logic state from the at least one memory cell of the sub-block by initiating applying a first voltage having a first magnitude and a first polarity to the at least one memory cell of the sub-block, and writing the first logic state to the at least one memory cell after reading the first logic state from the at least one memory cell by initiating applying a second voltage having a second magnitude and a second polarity that may be different than the first polarity to the at least one memory cell of the sub-block.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   determining a quantity of access operations performed on a sub-block of a memory array, the sub-block including a plurality of memory cells comprising a chalcogenide storage element;
   initiating a read refresh operation for the sub-block based at least in part on determining the quantity of access operations performed on the sub-block;
   reading, as part of the read refresh operation, a logic state of at least one memory cell of the sub-block based at least in part on initiating the read refresh operation;
   detecting a snapback event associated with the at least one memory cell of the sub-block occurs; and
   refreshing, as part of the read refresh operation, the at least one memory cell of the sub-block based at least in part on the logic state and detecting the snapback event.

2. The method of claim 1, further comprising:
   applying a first voltage having a first magnitude to the at least one memory cell based at least in part on reading the logic state of the at least one memory cell; and
   applying a second voltage to the at least one memory cell of the sub-block having a second magnitude greater than the first magnitude of the first voltage based at least in part on the snapback event not occurring after applying the first voltage, wherein detecting the snapback event is based at least in part on applying the second voltage.

3. The method of claim 2, wherein refreshing the at least one memory cell of the sub-block comprises:
   applying a third voltage having a third magnitude and a first polarity different than a second polarity of the first voltage and the second voltage to the at least one memory cell based at least in part on detecting the snapback event associated with applying the second voltage.

4. The method of claim 2, wherein refreshing the at least one memory cell of the sub-block comprises:
   rewriting the logic state to the at least one memory cell of the sub-block using a third voltage that has a different polarity than the first voltage and the second voltage based at least in part on detecting the snapback event associated with applying the second voltage.

5. The method of claim 1, further comprising:
   applying a first voltage having a first magnitude to the at least one memory cell based at least in part on reading the logic state of the at least one memory cell, wherein detecting the snapback event is based at least in part on applying the first voltage; and
   refraining from refreshing the at least one memory cell of the sub-block based at least in part on detecting the snapback event after applying the first voltage.

6. The method of claim 1, further comprising:
   writing a second logic state different than the logic state to the at least one memory cell of the sub-block based at least in part on reading the logic state from the at least one memory cell of the sub-block; and
   writing the logic state to the at least one memory cell of the sub-block based at least in part on writing the second logic state to the at least one memory cell of the sub-block.

7. The method of claim 6, further comprising:
   applying a first voltage having a first magnitude to the at least one memory cell based at least in part on reading the logic state of the at least one memory cell; and
   thresholding the at least one memory cell of the sub-block towards a first logic state based at least in part on the snapback event not occurring after applying the first voltage, wherein writing the second logic state is based at least in part on thresholding the at least one memory cell of the sub-block.

8. The method of claim 1, further comprising:
   applying a first voltage having a first magnitude and a first polarity to the at least one memory cell to determine whether the at least one memory cell stores a second logic state based at least in part on reading the logic state of the at least one memory cell;
   applying a second voltage having a second magnitude and a second polarity to the at least one memory cell to threshold the at least one memory cell based at least in part on the snapback event not occurring after applying the first voltage;

applying a third voltage having a third magnitude and the first polarity to the at least one memory cell of the sub-block to write the second logic state to the at least one memory cell based at least in part on applying the second voltage; and applying a fourth voltage having a fourth magnitude and the second polarity to the at least one memory cell of the sub-block to write the logic state to the at least one memory cell based at least in part on applying the fourth voltage.

9. The method of claim 1, further comprising:
receiving an operation code to initiate the read refresh operation based at least in part on the quantity of access operations performed on the sub-block.

10. The method of claim 1, wherein the read refresh operation comprises a single operation to read the logic state of the at least one memory cell of the sub-block.

11. The method of claim 1, further comprising:
receiving, from a host device, a first operation code to perform a first type of read refresh operation based at least in part on a first quantity of access operations performed on the sub-block over a first duration of time satisfying a first threshold; and
receiving, from the host device, a second operation code to perform a second type of read refresh operation based at least in part on a second quantity of access operations performed on the sub-block over a second duration of time satisfying a second threshold.

12. The method of claim 1, further comprising:
incrementing a counter based at least in part on an access operation being performed on the sub-block, wherein the read refresh operation is performed based at least in part on a value of the counter not exceeding a threshold value.

13. A method, comprising:
determining a quantity of access operations performed on a sub-block of a memory array, the sub-block including a plurality of memory cells comprising a chalcogenide storage element;
initiating a read refresh operation for the sub-block based at least in part on determining the quantity of access operations performed on the sub-block;
reading, as part of the read refresh operation, a logic state of at least one memory cell of the sub-block based at least in part on initiating the read refresh operation, wherein reading the logic state of the at least one memory cell of the sub-block comprises:
applying a first voltage to the at least one memory cell of the sub-block; and
determining whether a snapback event associated with the at least one memory cell occurs based at least in part on applying the first voltage; and
refreshing, as part of the read refresh operation, the at least one memory cell of the sub-block based at least in part on the lotic state.

14. A method, comprising:
identifying a quantity of access operations performed on each of a plurality of sub-blocks of a memory array, each sub-block including a plurality of memory cells comprising a chalcogenide storage element;
determining to perform a first read refresh operation associated with a first threshold or a second read refresh operation associated with a second threshold on a sub-block of the plurality of sub-blocks based at least in part on the quantity of access operations performed on the sub-block;
detecting a snapback event associated with at least one memory cell of the sub-block occurs; and
performing the first read refresh operation on the sub-block based at least in part on the quantity of access operations performed on the sub-block satisfying the first threshold and failing to satisfy the second threshold and detecting the snapback event.

15. The method of claim 14, wherein the first read refresh operation comprises:
reading a first logic state from at least one memory cell of the sub-block; and
writing the first logic state to the at least one memory cell after reading the first logic state from the at least one memory cell.

16. The method of claim 15, wherein:
reading the first logic state comprises applying a first voltage having a first magnitude and a first polarity to the at least one memory cell of the sub-block; and
writing the first logic state comprises applying a second voltage having a second magnitude and a second polarity that is different than the first polarity to the at least one memory cell of the sub-block.

17. The method of claim 14, further comprising:
performing the second read refresh operation on the sub-block based at least in part on the quantity of access operations performed on the sub-block failing to satisfy the second threshold that is lower than the first threshold, wherein the second read refresh operation comprises;
reading a first logic state from of at least one memory cell of the sub-block;
writing a second logic state to the at least one memory cell of the sub-block after reading the first logic state; and
writing the first logic state to the at least one memory cell of the sub-block after reading the first logic state.

18. The method of claim 17, wherein:
reading the first logic state comprises applying a third voltage having a first polarity to the at least one memory cell of the sub-block;
writing the second logic state comprises applying a fourth voltage having a second polarity that is different than the first polarity to the at least one memory cell of the sub-block; and
writing the first logic state comprises applying a fifth voltage having the first polarity to the at least one memory cell of the sub-block.

19. The method of claim 17, wherein:
writing the first logic state to the at least one memory cell of the sub-block occurs before writing the second logic state to the at least one memory cell of the sub-block.

20. The method of claim 14, further comprising:
performing an access operation on at least one of the plurality of sub-blocks of the memory array; and
incrementing a value stored to a counter table associated with the at least one of the plurality of sub-blocks based at least in part on performing the access operation, wherein the counter table is configured to track the quantity of access operations performed on each sub-block of the memory array.

21. The method of claim 20, further comprising:
identifying, based on the value of the counter table, the quantity of access operations performed on each of the plurality of sub-blocks of the memory array at a periodic rate; and resetting a respective value of the counter table based at least in part on performing the first read refresh operation or the second read refresh operation on the associated sub-block.

22. The method of claim 20, further comprising:

identifying a lowest value of the counter table based at least in part on performing the access operation on the at least one of the plurality of sub-blocks of the memory array; and performing the first read refresh operation on a sub-block associated with the lowest value of the counter table.

23. A method, comprising:

identifying a quantity of access operations performed on each of a plurality of sub-blocks of a memory array, each sub-block including a plurality of memory cells comprising a chalcogenide storage element;

determining to perform a first read refresh operation associated with a first threshold or a second read refresh operation associated with a second threshold on a sub-block of the plurality of sub-blocks based at least in part on the quantity of access operations performed on the sub-block;

receiving a first operation code configured to initiate the first read refresh operation and; and receiving a second operation code configured to initiate the second read refresh operation based at least in part on the quantity of access operations performed on the sub-block; and performing the first read refresh operation on the sub-block based at least in part on the quantity of access operations performed on the sub-block satisfying the first threshold and failing to satisfy the second threshold.

24. An apparatus, comprising:

a memory array comprising a plurality of sub-blocks, each sub-block comprising a plurality of memory cells that each include a chalcogenide storage element; and a controller coupled with the memory array and operable to:

determine a quantity of access operations performed on a sub-block of the plurality of sub-blocks of the memory array and;

detect a snapback event associated with at least one memory cell of the sub-block occurs.

25. The apparatus of claim 24, wherein the controller is operable to refresh the at least one memory cell of the sub-block by:

reading a first logic state from the at least one memory cell of the sub-block by initiating applying a first voltage having a first magnitude and a first polarity to the at least one memory cell of the sub-block; and writing the first logic state to the at least one memory cell after reading the first logic state from the at least one memory cell by initiating applying a second voltage having a second magnitude and a second polarity that is different than the first polarity to the at least one memory cell of the sub-block.

* * * * *